(12) United States Patent
Nambu et al.

(10) Patent No.: US 6,229,745 B1
(45) Date of Patent: May 8, 2001

(54) SEMICONDUCTOR MEMORY

(75) Inventors: Hiroaki Nambu, Sagamihara; Kazuo Kanetani, Akishima; Kaname Yamasaki, Kokubunji; Fumihiko Arakawa, Tokorozawa; Takeshi Kusunoki, Tachikawa, all of (JP)

(73) Assignees: Hitachi, Ltd., Tokyo; Hitachi Device Engineering Co., Ltd., Chiba, both of (JP)

( * ) Notice: Subject to any disclaimer, the term of this patent is extended or adjusted under 35 U.S.C. 154(b) by 0 days.

(21) Appl. No.: 09/558,375

(22) Filed: Apr. 26, 2000

(30) Foreign Application Priority Data

Apr. 28, 1999 (JP) .................................................. 11-121944

(51) Int. Cl.[7] .................................................. G11C 7/02
(52) U.S. Cl. .............................................................. 365/207
(58) Field of Search ..................................... 365/207, 203, 365/208, 189.05

(56) References Cited

U.S. PATENT DOCUMENTS

| 4,751,681 | * | 6/1988 | Hashimoto | 365/207 |
| 5,237,533 | * | 8/1993 | Papaliolios | 365/207 |
| 5,477,498 | * | 12/1995 | Ooishi | 365/208 |
| 5,526,314 | * | 6/1996 | Kumar | 365/207 |
| 5,627,484 | * | 5/1997 | Tuminaro et al. | 327/56 |

OTHER PUBLICATIONS

1998 IEEE International Solid–State Circuits Conference, Digest of Technical Papers, 1998, pp. 360–361. Feb., 1998.

\* cited by examiner

*Primary Examiner*—Richard Elms
*Assistant Examiner*—Anh Phung
(74) *Attorney, Agent, or Firm*—Mattingly, Stanger & Malur, P.C.

(57) ABSTRACT

A semiconductor memory in accordance with the present invention includes a sense amplifier composed of a plurality of MOS transistors. When the sense amplifier is on standby, a first control circuit brings an input signal of the sense amplifier to zero. A second control circuit uses voltages developed because of an offset voltage occurring in the sense amplifier to feed back the potentials in the wells of the MOS transistors so that the offset voltage will be nullified. When the offset voltage occurring in the sense amplifier is nullified, a delay time required by the sense amplifier is shortened. This results in the high-speed semiconductor memory.

6 Claims, 14 Drawing Sheets

SEMICONDUCTOR MEMORY

BACKGROUND OF THE INVENTION

1. Field of the Invention

The present invention relates to a semiconductor memory, or more particularly, to a circuit technology preferred for shortening a delay time required by a sense amplifier.

2. Description of the Related Art

Numerous sense amplifiers have been proposed for quickly amplifying a small signal output from a memory cell of a semiconductor memory. Sense amplifiers that can amplify a signal most quickly include a circuit disclosed in the digest of technical papers published at the IEEE International Solid-state Circuits Conference for 1998 pp. 360–361.

FIG. 1 is a circuit diagram concerning the related art. In FIG. 1, there are shown memory cells MC0, etc., and MCn, bit line select Y switches MYL and MYR. Bit line select signals YS0, etc., and YSn are used to control the Y switches. Transistors MPL, MPR, and ME constitute a precharge circuit for precharging common data lines CDL and CDR. A precharge control signal CDE is used to precharge the common data lines. A circuit composed of transistors M10 to M16 is a first-stage sub-sense amplifier. A circuit composed of transistors M20 to M27 is a second-stage sub-sense amplifier. Also shown are a sense amplifier activating signal SC, inverters IV0 and IV1, and a sense amplifier output node SQ.

Referring to FIG. 2 showing waveforms (solid lines) that indicate actions to be performed, a description will be made of the actions to be performed in the circuitry of the related art shown in FIG. 1.

At time instant t0, the precharge control signal CDE is low. The common data lines CDL and CDR are precharged and the potentials on the common data lines are driven high. Moreover, the sense amplifier activating signal SC is low. The sense amplifier is on standby.

Thereafter, the Y switches are turned on. At time instant t4, the precharge control signal CDE is driven high. The potential on one of the common data lines CDL and CDR starts dropping according to information stored in a selected memory cell (in this example, the potential on the common data line CDL drops).

Thereafter, at time instant t6, the sense amplifier activating signal SC is driven high in order to activate the sense amplifier. The potential on one of output signal lines SQAL and SQAR extending from the first-stage sub-sense amplifier starts dropping (in this example, the potential on the output signal line SQAL drops).

A potential difference between the output signal lines SQAL and SQAR is amplified by the second-stage sub-sense amplifier, and then applied to the sense amplifier output node SQ via the inverters IV0 and IV1. In this example, the potential difference between the output signal lines SQAL and SQAR becomes equal to nearly a half of a supply voltage VDD at time instant t8. The potential at the sense amplifier output node SQ is driven low.

Thereafter, the precharge control signal CDE is driven low at time instant t10. The common data lines CDL and CDR are precharged and have the potential thereon brought back to high. When the sense amplifier activating signal SC is driven low (time instant t10), the potentials on the output signal lines SQAL and SQAR are brought back to high. The sense amplifier re-enters a standby state.

At time instant t12, the sense amplifier output node (hereinafter, simply, output node) SQ is brought back to high.

Thereafter, the next cycle starts at time instant t14. The same actions as those of the first cycle start. In this example, information stored in a memory cell selected for the second cycle is opposite to information stored in the memory cell selected for the first cycle. Therefore, when the precharge control signal CDE is driven high at time instant t14, the potential on the common data line CDR drops.

When the sense amplifier activating signal SC is driven high at time instant t16 in order to activate the sense amplifier, the potential on the output signal line SQAR starts dropping. During the second cycle, the relationship between the potentials on the output signal lines SQAL and SQAR is opposite to that attained during the first cycle. The potential at the output node SQ remains high.

A circuit in the next stage for inputting the potential at the output node SQ can read information stored in a selected memory cell by detecting whether the potential at the output node SQ goes low or remains high.

As mentioned above, according to the circuitry of the related art shown in FIG. 1, the sense amplifier is composed of two sub-sense amplifiers in efforts to realize fast reading.

However, the conventional sense amplifier suffers from an offset voltage derived from differences in properties of transistors constituting the sense amplifier. Limitations are therefore imposed on fast reading, which will be described below.

In the circuitry of the related art shown in FIG. 1, the first-stage sub-sense amplifier suffers from an offset voltage. When the activating signal SC is driven high in order to activate the sense amplifier, even if a potential difference between the common data lines CDL and CDR is zero, one of the potentials on the output signal lines SQAL and SQAR starts dropping without fail. Hereinafter, assume that the potential on the output signal line SQAL drops.

FIG. 2 shows waveforms indicating actions to be performed when the timing of activating the sense amplifier using the activating signal SC is advanced because of a variation in temperature or supply voltage. Assume that the timing of activating the sense amplifier with the activating signal SC driven high is advanced from time instant t6 to time instant t2. Although a potential difference between the common data lines CDL and CDR is zero, the potential on the output signal line SQAL starts dropping because of an offset voltage. A potential difference between the output signal lines SQAL and SQAR is amplified by the second-stage sub-sense amplifier, and applied to the output node SQ via the inverters IV0 and IV1.

In this example, when the potential difference between the output signal lines SQAL and SQAR becomes equal to nearly a half of the supply voltage VDD at time instant t4, the potential at the output node SQ is driven low. Therefore, as far as the first cycle is concerned, when the timing of activating the sense amplifier using the activating signal SC is advanced, the potential at the output node SQ is reversed earlier. Thus, reading appears to be speeded up.

However, a problem occurs during the second cycle. Assume that the timing of activating the sense amplifier with the activating signal SC driven high is advanced from time instant t16 to time instant t12 during the second cycle. In this case, although a potential difference between the common data lines CDL and CDR is zero, the potential on the output signal line SQAL starts dropping because of an offset voltage in the same manner as it is during the first cycle. A potential difference between the output signal lines SQAL and SQAR is amplified by the second-stage sub-sense amplifier, and applied to the output node SQ via the inverters IV0 and IV1. The potential difference between the output signal lines SQAL and SQAR becomes equal to nearly a half of the supply voltage at time instant t14. Consequently, the potential at the output node SQ is driven low. This causes the circuit in the next stage for detecting whether the potential at the output node SQ goes low or remains high to malfunction.

For speeding up the reading action of the sense amplifier, the timing of activating the sense amplifier should be advanced. However, if the timing is too early, a malfunction occurs because of a variation in temperature or supply voltage. Namely, an offset voltage occurs because of the differences in properties of transistors constituting the sense amplifier, limitations are imposed on fast reading.

SUMMARY OF THE INVENTION

Accordingly, an object of the present invention is to provide a semiconductor memory having a sense amplifier whose reading action is speeded up by advancing the timing of activating the sense amplifier despite the differences in properties of transistors constituting the sense amplifier.

For accomplishing the object, there is provided a semiconductor memory having memory cells arranged on a semiconductor wafer in the form of a lattice, and including a sense amplifier composed of a plurality of MOS transistors for reading information from the memory cells.

In the semiconductor memory, the well of one MOS transistor belonging to at least one of a plurality of pairs of MOS transistors, each pair of which is connected mutually symmetrically and has the same conductivity channel, included in the plurality of MOS transistors constituting the sense amplifier is electrically isolated from the wells of the other MOS transistors.

Moreover, a first control circuit is included for bringing an input signal of the sense amplifier to zero. Herein, "zero" means a level at which the input signal is not sensed by the sense amplifier on the assumption that the offset voltage derived from the differences in properties of transistors constituting the sense amplifier is nil. Otherwise, "zero" means a level of the input signal not changing an output of the sense amplifier. Thus, "zero" is not limited to an exactly zero level. The same applies to the subsequent description.

Moreover, a second control circuit is included for using a signal to control the potential in the electrically-isolated well in one of paired MOS transistors so that the offset voltage will be nearly nullified. The signal is developed because of an offset voltage occurring in the sense amplifier whose input signal is brought to zero by the first control circuit.

Moreover, the semiconductor memory may be formed on a silicon-on-insulator (SOI) wafer. This leads to faster reading.

The second control circuit may be designed to nearly float at least one of the wells in the MOS transistors when the sense amplifier is activated. This leads to faster reading.

Capacitors may be inserted in output lines extending from the second control circuit for controlling the potentials in the wells. This leads to faster reading.

The first control circuit may be realized with a precharge circuit for precharging common data lines in response to a precharge control signal.

Preferably, the second control circuit should be realized with a differential amplifier or a switching circuit.

DESCRIPTION OF THE PREFERRED EMBODIMENTS

Figure 3:
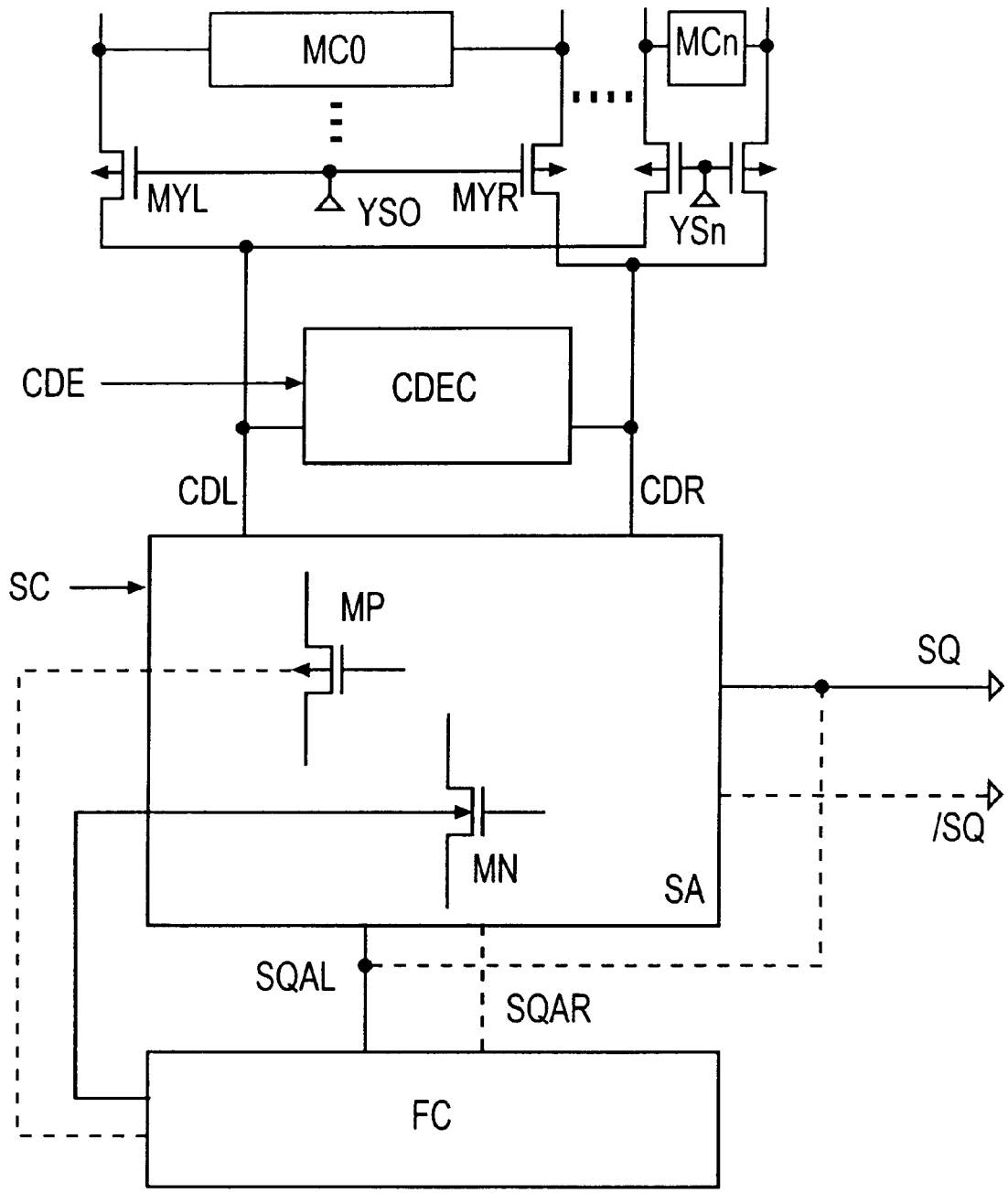
FIG. 3 is a circuit block diagram showing a preferred embodiment of the present invention.
Figure 4:
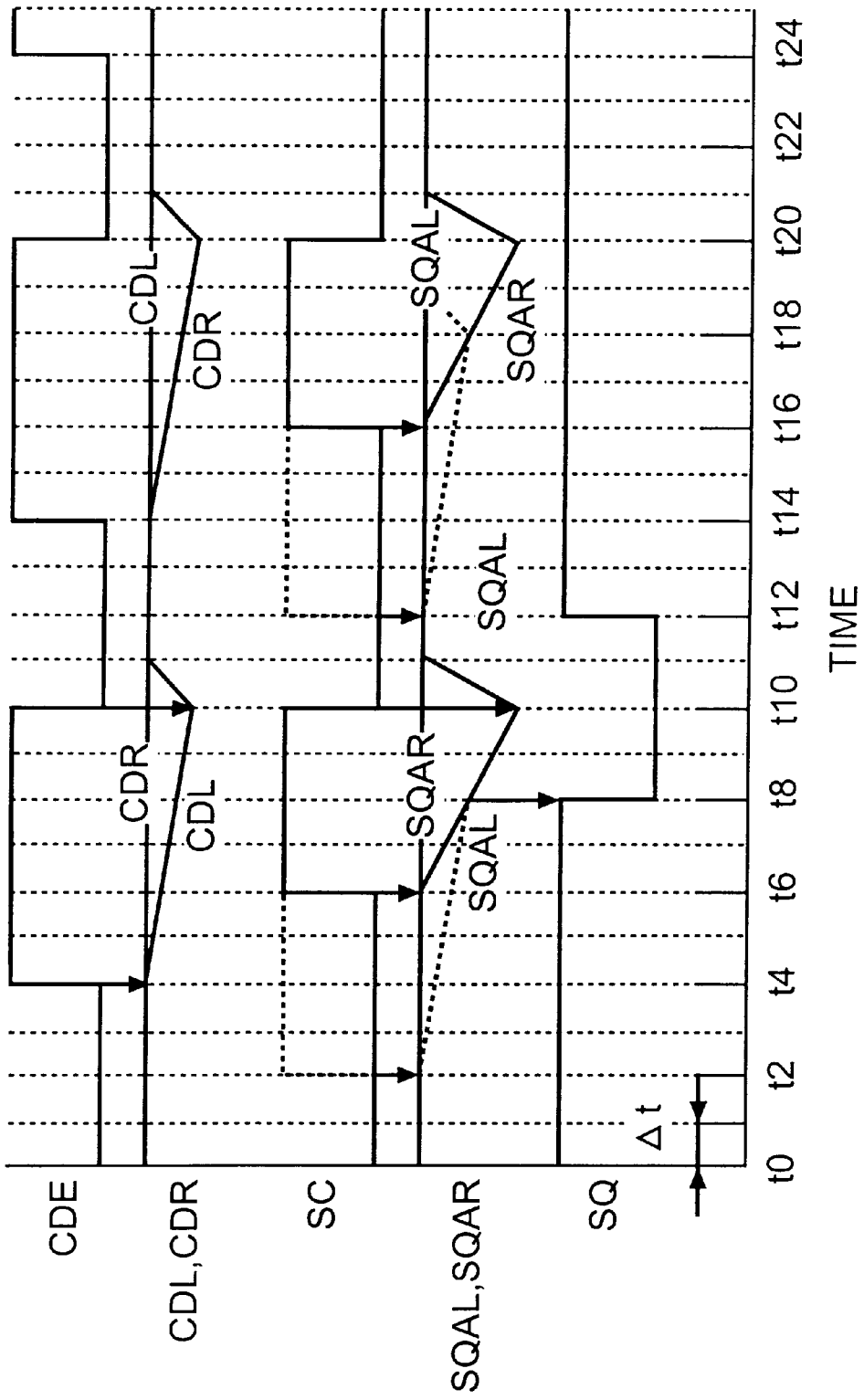
FIG. 4 is a timing chart showing waveforms that indicate actions to be performed in the circuitry shown in FIG. 3.

FIG. 3 is a circuit block diagram showing a major portion of a preferred embodiment of a semiconductor memory in accordance with the present invention, indicating the basic concept of the present invention. FIG. 4 is a timing chart showing an example of waveforms that indicate actions to be performed in the preferred embodiment. In FIG. 3, the same reference numerals are assigned to components identical to those of the related art shown in FIG. 1. The same applies to the drawings showing the first to seventh examples to be described later.

Referring to FIG. 3, a semiconductor memory consists of memory cells MC0 to MCn arranged on a semiconductor wafer in the form of a lattice, and a sense amplifier SA for reading information from the memory cells. The sense amplifier SA includes a plurality of MOS transistors MN and MP. The transistors MN are n-channel MOS (NMOS) transistors, while the transistors MP are p-channel MOS (PMOS) transistors.

The well of one MOS transistor MN (or MP) belonging to at least one pair of MOS transistors out of the plurality of MOS transistors constituting the sense amplifier is electrically isolated from the wells of the other MOS transistors. Herein, paired MOS transistors are connected mutually symmetrically. The pair of MOS transistors is connected mutually symmetrically and has the same conductivity channel.

A first control circuit CDEC is included for bringing an input signal of the sense amplifier SA to zero when the sense amplifier SA is on standby. A second control circuit FC is included for controlling the potentials in the wells of the MOS transistors MN (or MP) so that an offset voltage occurring in the sense amplifier SA will be nearly nullified. At this time, the second control circuit uses a voltage to control the well potentials in the MOS transistors. The voltage is developed on an output signal line SQAL (or SQAR) because of the offset voltage occurring in the sense amplifier when the first control circuit CDEC brings the input signal of the sense amplifier SA to zero.

Thus, even when the transistors constituting the sense amplifier differ from one another in terms of property, since the offset voltage occurring in the sense amplifier SA is nearly nullified, the timing of activating the sense amplifier can be advanced. Consequently, the reading action of the sense amplifier is speeded up.

A description will be made with reference to FIG. 4 showing waveforms that indicate actions. Assume that a sense amplifier activating signal SC is driven high as indicated with a solid line in order to activate the sense amplifier SA at time instant t6 or t16. In this case, actions to be performed are identical to those in accordance with the related art shown in FIG. 2. Dot lines indicate that the actions to be performed as indicated with the waveforms shown in FIG. 4 become different from the actions to be performed in the related art as indicated with the waveforms shown in FIG. 2. Namely, different actions are performed when the timing of activating the sense amplifier using the activating signal SC is advanced because of a variation in temperature or supply voltage.

Specifically, assume that the timing of activating the sense amplifier SA with the activating signal SC driven high is advanced from time instant t6 to time instant t2 or from time instant t16 to time instant t12. According to the related art shown in FIG. 2, although a potential difference between the common data lines CDL and CDR is zero, the potential on the output signal line SQAL starts dropping because of the offset voltage.

However, according to the preferred embodiment shown in FIG. 4, the sense amplifier SA is on standby during a period from time instant t0 to t2 or from time instant t10 to t12. At this time, the second control circuit FC uses a voltage developed on the output signal line SQAL (or SQAR) because of the offset voltage occurring in the sense amplifier to feed back the potentials in the wells of the MOS transistors MN (or MP). Thus, the properties of the MOS transistors MN (or MP) are changed, and the offset voltage occurring in the sense amplifier SA is nearly nullified. Referring to FIG. 4 that shows the waveforms attained after feedback is completed, a signal stemming from the offset voltage is not developed on the output signal line SQAL (or SQAR).

Figure 2:
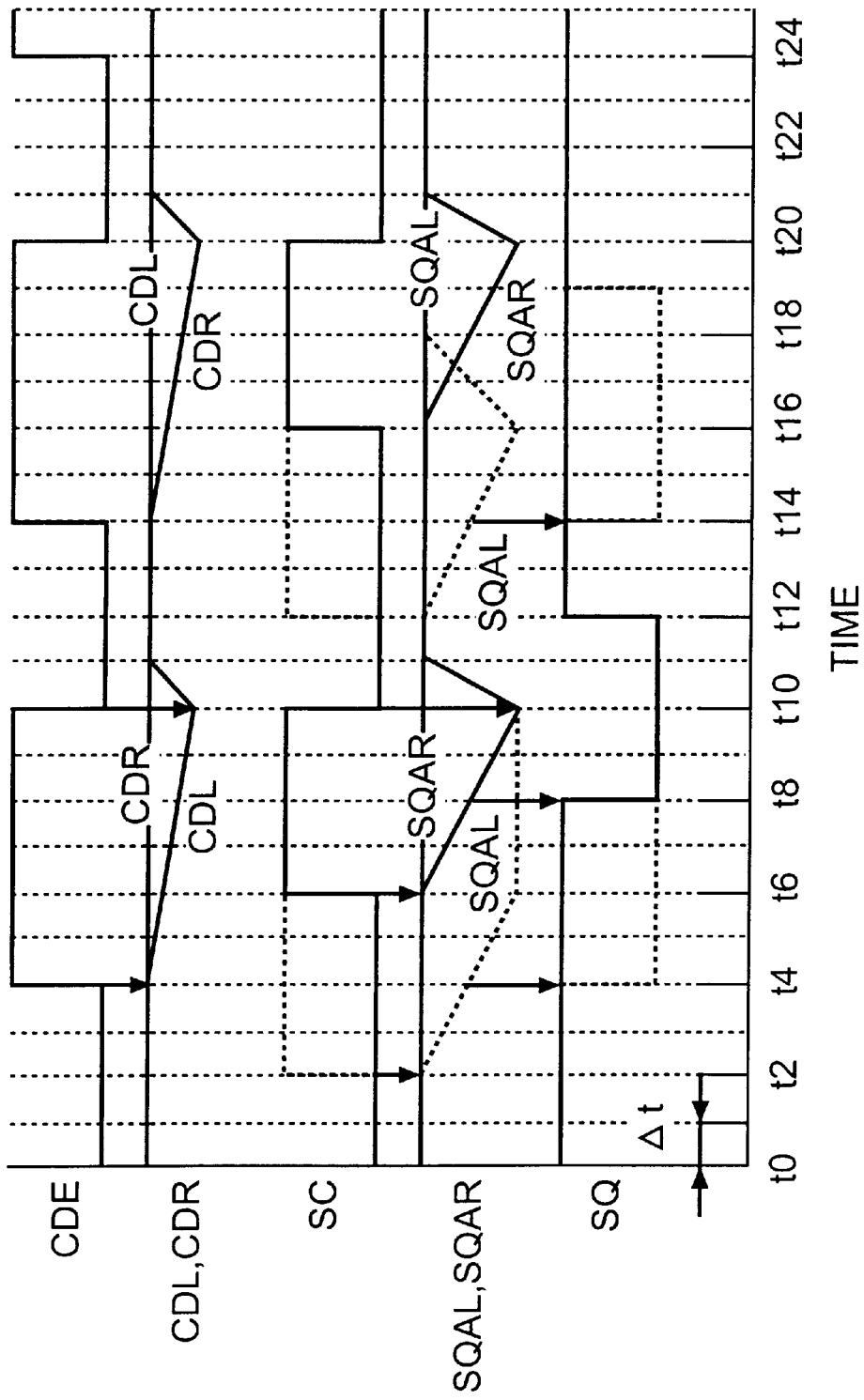
FIG. 2 is a timing chart showing waveforms that indicate actions to be performed in the related art.

Even when the sense amplifier activating signal SC is driven high at time instant t2 or time instant t12, the potential on the output signal line SQAL does not drop so greatly as it is in the related art shown in FIG. 2. Therefore, during the second cycle during which a problem occurs according to the related art shown in FIG. 2, after the activating signal SC is driven high at time instant t12, the potential on the output signal line SQAL drops a little. However, before a potential difference between the output signal lines SQAL and SQAR becomes equal to a half of a supply voltage, the potential on the output signal line SQAR starts dropping (time instant t16). Thereafter, the potential on the output signal line SQAL starts rising (time instant t18). It will therefore not take place that the potential at the output node SQ in the sense amplifier SA is driven low as it is in the related art shown in FIG. 2. A malfunction will not occur.

As mentioned above, according to the present invention, even when the transistors constituting the sense amplifier included in the semiconductor memory differ from one another in terms of property, the offset voltage occurring in the sense amplifier can be nearly nullified. Therefore, even when the timing of activating the sense amplifier is advanced, a malfunction derived from a variation in temperature or supply voltage will not occur. Consequently, the timing of activating the sense amplifier can be advanced in order to speed up the reading action of the sense amplifier. This leads to the high-speed semiconductor memory.

According to the preferred embodiment, the potential in the well of one of paired MOS transistors MN or MP is controlled using the second control circuit FC. Assume that there are at least one pair of NMOS transistors MN whose wells are electrically isolated from each other and one pair of PMOS transistors MP whose wells are electrically isolated from each other. In this case, the second control circuit may control the well of one MOS transistor MN or MP. Otherwise, as indicated with dot lines in FIG. 3, the second control circuit may control the wells of the paired MOS transistors or may control the wells of ones of the paired MOS transistors. An input signal of the second control circuit FC may be a potential on one of the output signal lines SQAL and SQAR linking the sub-sense amplifiers. When the second control circuit FC is realized with a differential amplifier, the potentials on both the output signal lines may be input to the second control circuit FC. Instead of inputting the potentials on the output signal lines SQAL and SQAR linking the sub-sense amplifiers, the potential at an output node SQ of the sense amplifier and/or the potential at an inverting output node /SQ may be input to the second control circuit. Herein, / succeeding SQ means an opposite polarity.

Next, examples of the semiconductor memory in accordance with the present invention will be described with reference to the appended drawings.

FIRST EXAMPLE

Figure 5:
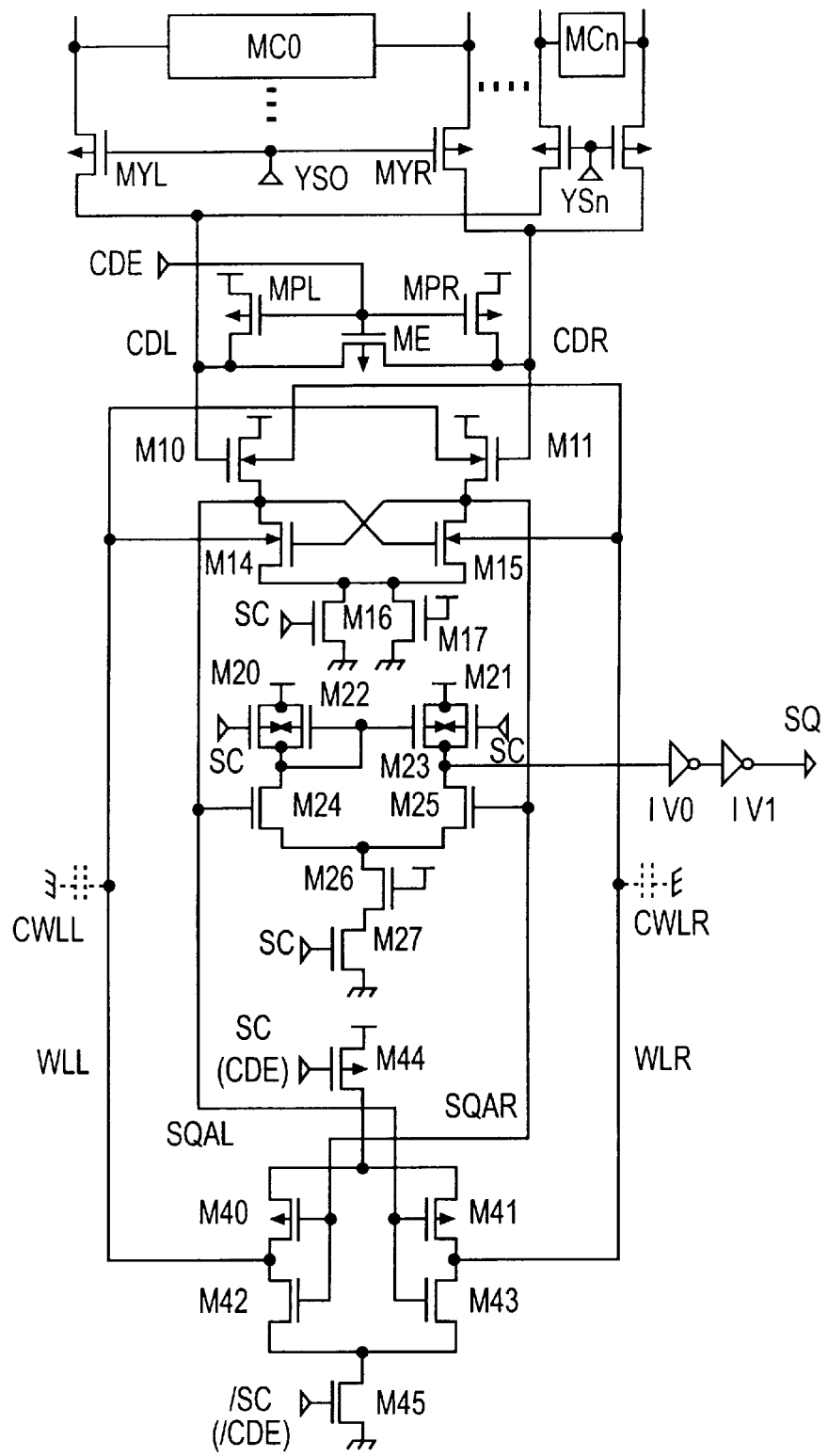
FIG. 5 is a circuit diagram showing the first example of the present invention.

FIG. 5 is a circuit diagram showing a major portion of a semiconductor memory in accordance with the first example of the present invention. The circuitry shown in FIG. 5 is a practical form of the circuitry shown in FIG. 3. The circuits in FIG. 3 are realized using CMOS transistors.

Figure 1:
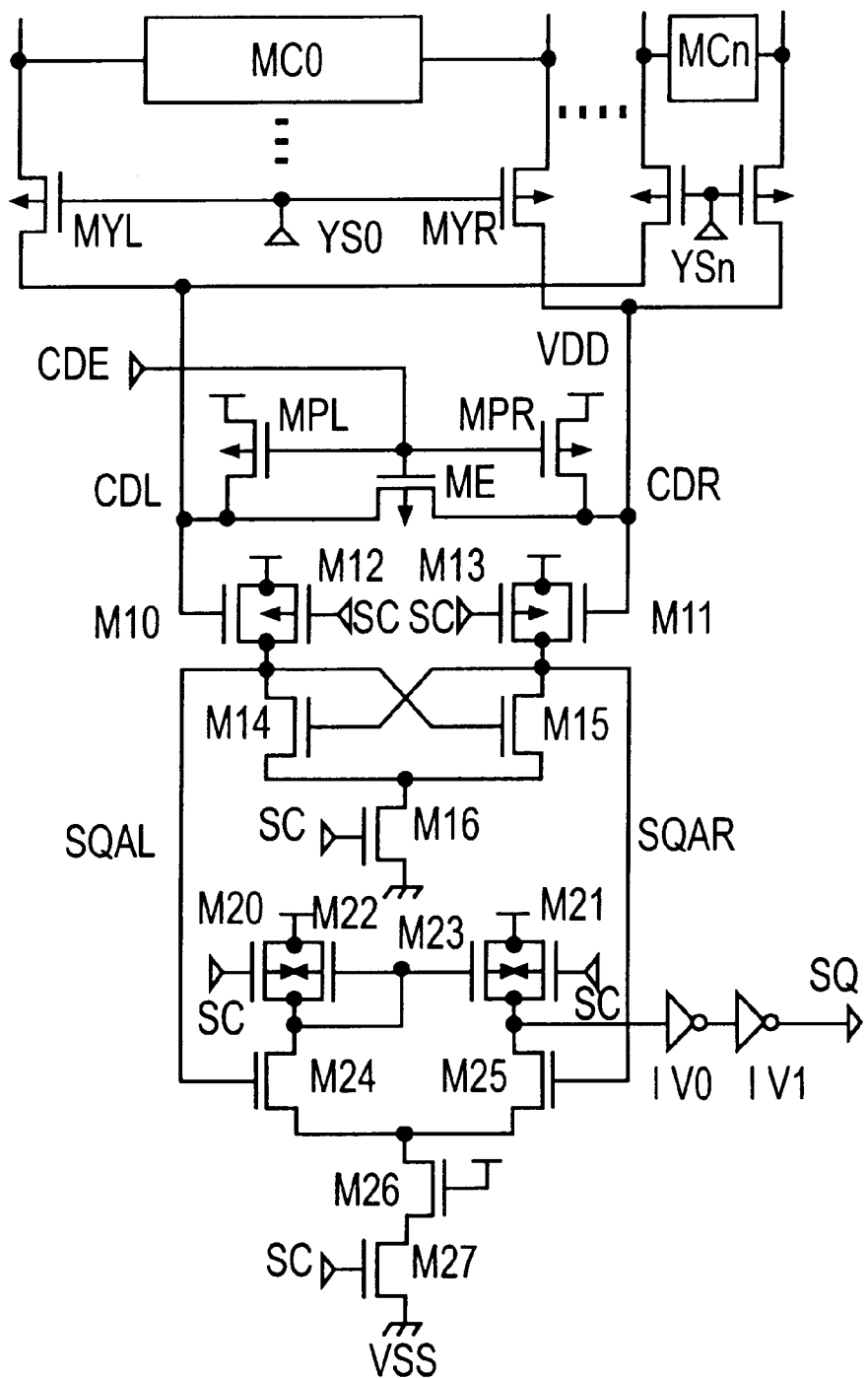
FIG. 1 is a circuit diagram concerning a related art.

A sense amplifier shown in FIG. 5 consists of, similarly to the one of the related art shown in FIG. 1, a first-stage sub-sense amplifier composed of MOS transistors M10 to M16, and a second-stage sub-sense amplifier composed of MOS transistors M20 to M27. The wells of paired MOS transistors M10 and M11 and paired MOS transistors M14 and M15 are electrically isolated from the wells of the other MOS transistors. Herein, the paired MOS transistors are connected mutually symmetrically in the sense amplifier. When the sense amplifier is on standby, a first control circuit composed of MOS transistors MPL, MPR, and ME brings an input signal of the sense amplifier to zero. A second control circuit is composed of MOS transistors M40 to M45. The second control circuit uses voltages, which are developed on the output signal lines SQAL and SQAR because of an offset voltage occurring in the sense amplifier, to feed back the potentials in the wells in the paired MOS transistors M10 and M11 and paired MOS transistors M14 and M15. The offset voltage occurring in the sense amplifier is thus nearly nullified. In other words, the potentials on output lines WLR and WLL extending from the second control circuit that inputs the voltages on the output signal lines SQAL and SQAR are applied to the wells in the MOS transistors M10, M15, M11, and M14.

Consequently, even when the transistors constituting the sense amplifier are mutually different in terms of property, since an offset voltage occurring in the sense amplifier is nearly nullified, the timing of activating the sense amplifier can be advanced. Eventually, the reading action of the sense amplifier is speeded up.

Figure 6:
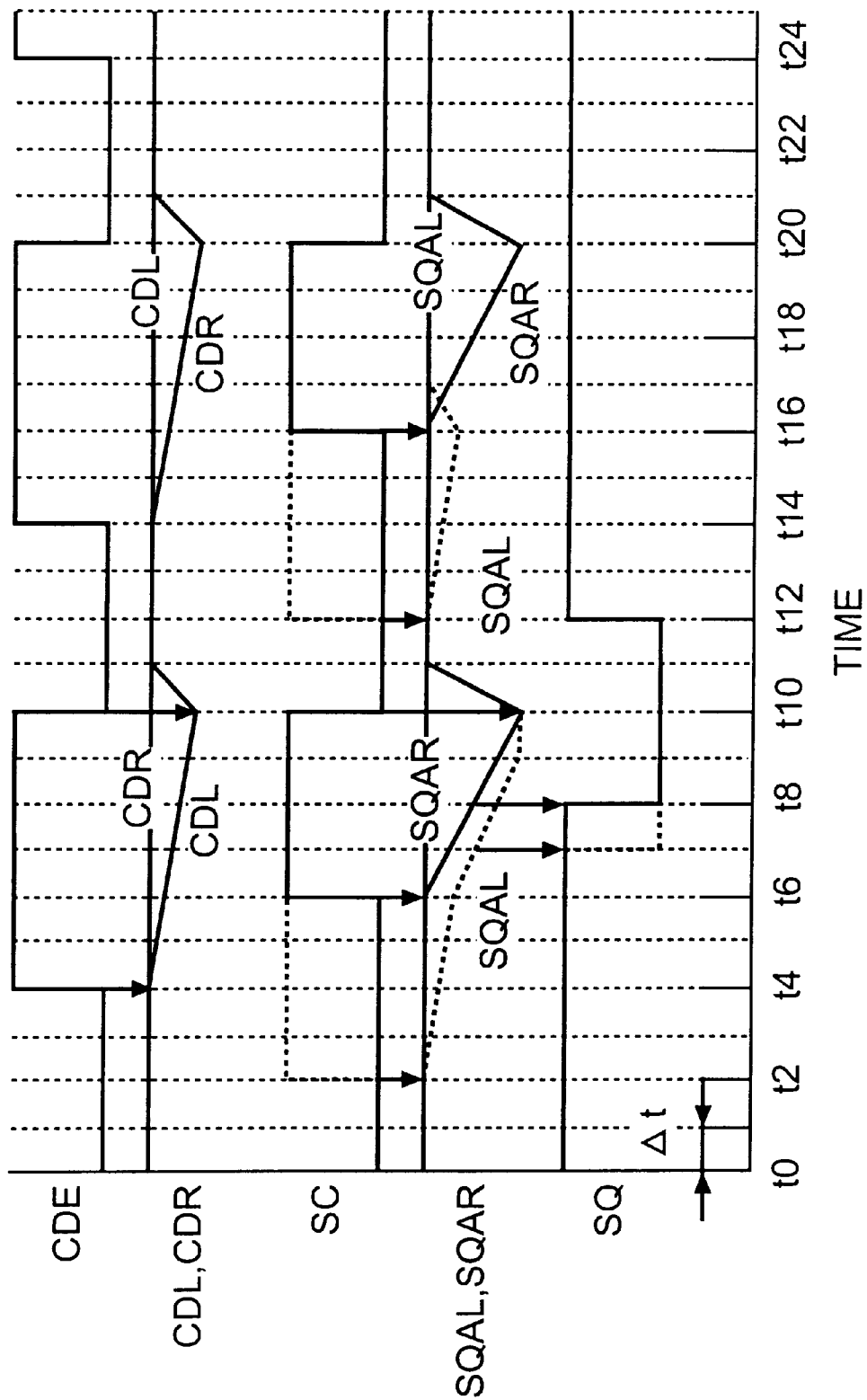
FIG. 6 is a timing chart showing waveforms that indicate actions to be performed in the circuitry shown in FIG. 5.

A description will be made with reference to FIG. 6 showing waveforms that indicate actions. First, a sense amplifier activating signal SC is driven high as indicated with a solid line. When the sense amplifier is activated at time instant t6 or t16, actions identical to those in the related art shown in FIG. 2 are performed.

The waveforms of FIG. 6 indicating actions are different from those of FIG. 2 indicating actions to be performed in the related art when the timing of activating the sense amplifier according to the activating signal SC is advanced because of a variation in temperature or supply voltage. Specifically, the activating signal SC is driven high, and the timing of activating the sense amplifier is advanced from time instant t6 to time instant t2 or from time instant t16 to time instant t12. According to the related art shown in FIG. 2, although apotential difference between the common data lines CDL and CDR is zero, the potential on the output signal line SQAL starts dropping because of the offset voltage.

According to the first example shown in FIG. 6, the sense amplifier is on standby during a period from time instant t0 to t2 or from time instant t10 to t12. At this time, the second control circuit uses voltages developed on the output signal lines SQAL and SQAR because of the offset voltage occurring in the sense amplifier to feedback the potentials in the wells of the paired MOS transistors M10 and M11 and paired MOS transistors M14 and M15. The properties of the paired MOS transistors M10 and M11, and M14 and M15 are thus changed, whereby the offset voltage occurring in the sense amplifier is nearly nullified.

A further description will be made below. As far as the circuitry shown in FIG. 5 is concerned, the MOS transistors M12 and M13 shown in FIG. 1 concerning the related art are not included but a MOS transistor M17 is added. When the activating signal SC is low and the sense amplifier is on standby, an offset voltage occurring in the first-stage sub-sense amplifier causes a voltage to develop on the output signal lines SQAL and SQAR. For example, when the threshold voltage of the MOS transistors M10 and M15 is higher than that of the MOS transistors M11 and M14, the potential on the output signal line SQAL drops.

On the other hand, when the activating signal SC (or a precharge control signal CDE used to precharge common data lines) is low, the MOS transistors M44 and M45 are turned on, and a differential amplifier composed of the MOS transistors M40 to M43 is activated. A potential difference between the output signal lines SQAL and SQAR is therefore amplified. Consequently, the potentials in the wells of the paired MOS transistors M10 and M11 and paired MOS transistors.M14 and M15 are controlled so that the offset voltage occurring in the sense amplifier will be nearly nullified.

For example, when the potential on the output signal line SQAL is lower, the potential on the output line WLR extending from the second control circuit which will be applied to the wells in the MOS transistors M10 and M15 rises.

Normally, when the potential in the well of an NMOS (PMOS) transistor rises (drops), the threshold voltage of the transistor decreases (increases (absolute value decreases)). The threshold voltage of the MOS transistors M10 and M15 decreases. In other words, the MOS transistors act so that the offset voltage occurring in the sense amplifier will be reduced. The potential on the output signal line SQAL rises. The actions are repeated as long as a potential difference is observed between the output signal lines SQAL and SQAR. Finally, the offset voltage occurring in the sense amplifier is nearly nullified.

Referring back to FIG. 6 showing waveforms that indicate actions, the circuitry shown in FIG. 5 is designed so that control will be given in order to nearly nullify the offset voltage occurring in the sense amplifier. Even when the activating signal SC is driven high at time instant t2 or time instant t12, the potential on the output signal line SQAL does not drop so largely as that in the related art shown in FIG. 2. Therefore, during the second cycle during which a problem occurs according the related art shown in FIG. 2, after the activating signal SC is driven high at time instant t12, the potential on the output signal line SQAL drops a little. However, the potential on the output signal line SQAL starts dropping before a potential difference between the output signal lines SQAL and SQAR becomes equal to a half of the supply voltage VDD. The potential on the output signal line SQAL starts rising (time instant t16). It will not take place that the potential at the sense amplifier output node SQ is driven low as it is in the related art shown in FIG. 2. A malfunction will therefore not occur.

As mentioned above, according to the first example, even when the MOS transistors constituting the sense amplifier mutually differ in terms of property, the offset voltage occurring in the sense amplifier can be nearly nullified. Even when the timing of activating the sense amplifier is advanced, a malfunction derived from a variation in temperature or supply voltage will not occur. Consequently, the timing of activating the sense amplifier can be advanced. Eventually, the reading action of the sense amplifier is speeded up.

Moreover, the sense amplifier employed in the first example may be formed on an SOI wafer. In this case, compared with when the sense amplifier is formed on an ordinary monocrystal silicon wafer, the capacitance of capacitors parasitic to the wells in the MOS transistors can be minimized. Consequently, the potentials in the wells can be controlled quickly. Eventually, the reading action of the sense amplifier is further speeded up.

Referring to FIG. 5, after the activating signal SC is driven high, the sense amplifier is activated. The MOS transistors M44 and M45 are then turned off. The differential amplifier composed of the MOS transistors M40 to M43 is deactivated. The wells in the paired MOS transistors M10 and M11 and paired transistors M14 and M15 are nearly floated. The parasitic capacitors of each pair of the MOS transistors M10, M11, M14, and M15 formed between the wells thereof and the substrate are connected in series with each other. Consequently, the capacitance of the parasitic capacitors is equivalently minimized.

Consequently, a drop in the potential on the output signal line SQAL is accelerated after time instant t6 as indicated with a dot line in FIG. 6. The time when a potential difference between the output signal lines SQAL and SQAR becomes equal to a half of a supply voltage is advanced. The time when the potential at the output node SQ is driven low is advanced from time instant t8 to time instant t7. When the sense amplifier is activated, if the wells of the MOS transistors are nearly floated, the reading action of the sense amplifier is further speeded up.

As indicated with dashed lines in FIG. 5, capacitors CWLL and CWLR may be inserted in the output lines (well nodes) WLL and WLR extending from the second control circuit to the wells of the MOS transistors M11, M10, M14, and M15. In this case, the phase of a feedback signal to be applied from the second control circuit to the wells of the MOS transistors can be set to an optimal value. Consequently, the reading action of the sense amplifier is further speeded up.

SECOND EXAMPLE

Figure 7:
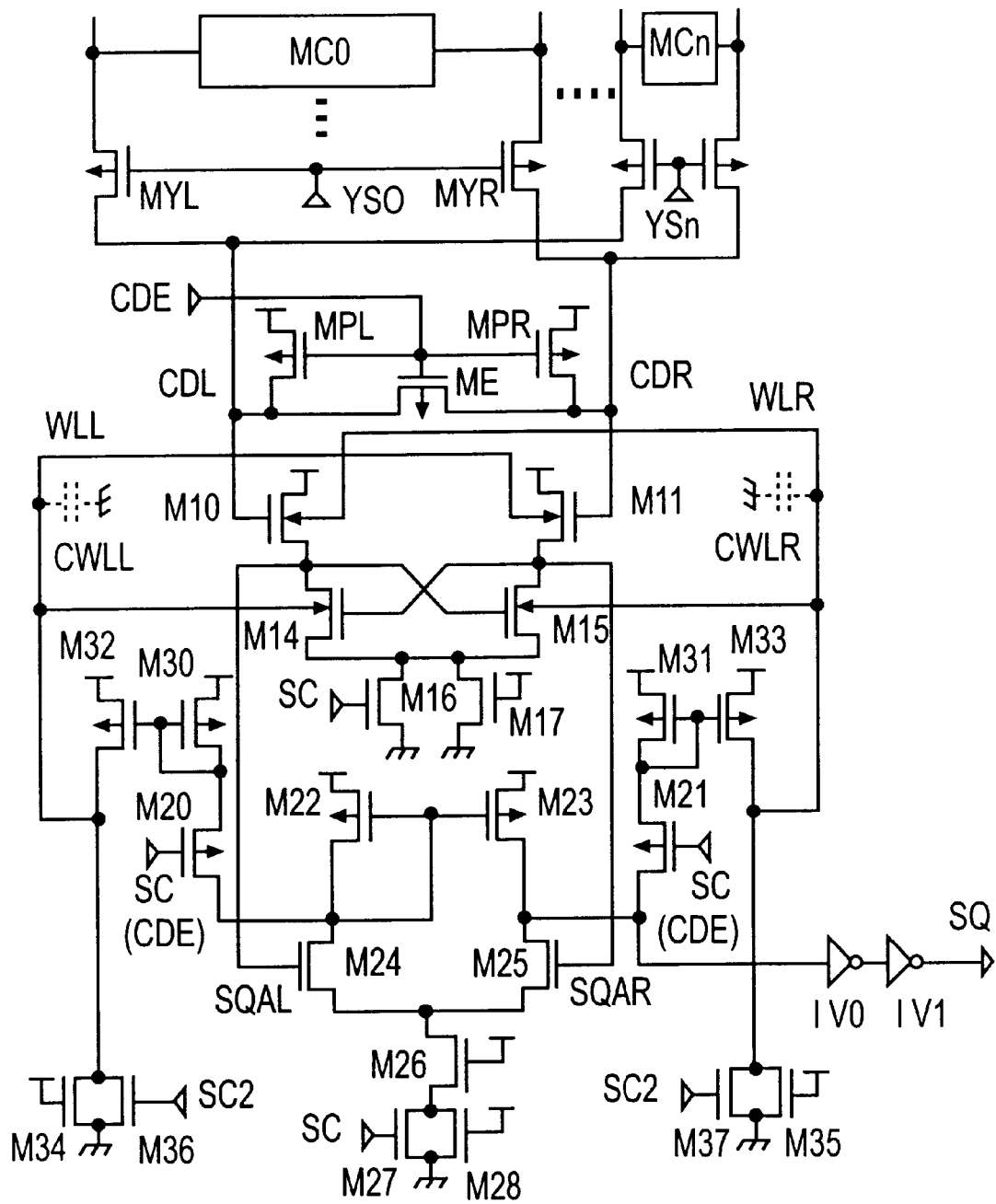
FIG. 7 is a circuit diagram showing the second example of the present invention.

FIG. 7 is a circuit diagram showing a major portion of a semiconductor memory in accordance with the second example of the present invention. The circuitry shown in FIG. 7 is a more practical form of the circuitry shown in FIG. 3. The circuits shown in FIG. 3 are realized with CMOS transistors as they are in the aforesaid example. Specifically, similarly to the circuitry shown in FIG. 3 or FIG. 5, when the sense amplifier is on standby, an input signal of the sense amplifier is brought to zero. Signals developed because of an offset voltage occurring in the sense amplifier are used to feed back the potentials in the wells of MOS transistors constituting the sense amplifier. The offset voltage occurring in the sense amplifier is thus nearly nullified.

A large difference from the circuitry shown in FIG. 5 lies in the configuration of a second control circuit for controlling the potentials in the wells of the MOS transistors constituting the sense amplifier using signals developed because of the offset voltage occurring in the sense amplifier. The actions of the circuits in this example will be described centered on the difference.

In the circuitry of the second example shown in FIG. 7, when the sense amplifier is on standby, voltages developed on the output signal lines SQAL and SQAR because of an offset voltage occurring in the first-stage sub-sense amplifier are input to the second-stage sub-sense amplifier. A second control circuit composed of MOS transistors M30 to M37 feeds back the potentials in the wells of the pairs 20 of MOS transistors M10, M11, M14, and M15. The properties of the pairs of MOS transistors M10, M11, M14, and M15 are thus changed. Consequently the offset voltage occurring in the sense amplifier is nearly nullified. In other words, the potentials on the output lines WLL and WLR extending from the second control circuit that inputs the potentials on the output signal lines SQAL and SQAR via the second-stage sub-sense amplifier are applied to the wells in the MOS transistors M11, M14, M10, and M15.

A further description will be made below. Similarly to the circuitry of the first example shown in FIG. 5, the MOS transistors M12 and M13 shown in FIG. 5 are excluded from the circuitry shown in FIG. 7 but a MOS transistor M17 is added thereto. When the activating signal SC is low and the sense amplifier is on standby, voltages are developed on the output signal lines SQAL and SQAR because of an offset voltage occurring in the first-stage sub-sense amplifier.

For example, when the threshold voltage of the MOS transistors M10 and M15 is higher than that of the MOS transistors M11 and M14, the potential on the output signal line SQAL drops.

Referring to FIG. 7, a MOS transistor M28 is added to the second-stage sub-sense amplifier. Owing to the is addition of the MOS transistor M28, even when the activating signal SC is low and the sense amplifier is on standby, the potentials on the output signal lines SQAL and SQAR are amplified. The amplified potentials are then input to the second control circuit composed of the MOS transistors M30 to M37 via the MOS transistors M20 and M21. The second control circuit controls the potentials in the wells of the pairs of MOS transistors M10, M11, M14, and M15 according to the input potentials so that the offset voltage occurring in the sense amplifier will be nearly nullified.

For example, when the potential on the output signal line SQAL is lower, a current is not supplied via the MOS transistor M20. Therefore, no current flows into the MOS transistors M30 and M32 constituting a current mirror circuit and the MOS transistor M34 forming a load circuit. The potential on the output line WLL extending from the second control circuit, which is applied to the wells in the MOS transistors M11 and M14, is lowered.

On the other hand, a current is supplied from the MOS transistor M21. A current therefore flows into the MOS transistors M31 and M33 constituting a current mirror circuit and the MOS transistor M35 forming a load circuit. The potential on the output line WLR extending from the second control circuit, which is applied to the wells in the MOS transistors M10 and M15, is raised. Consequently, the threshold voltage of the MOS transistors M10 and M15 decreases. Eventually, the offset voltage occurring in the sense amplifier is nearly nullified.

When the second-stage sub-sense amplifier is changed from an active state to a standby state, a current used to charge the drains of the MOS transistors M24 and M25 is supplied to the MOS transistors M36 and M37 employed in the second example as shown in FIG. 7. This is intended to prevent the potentials on the output lines WLL and WLR extending from the second control circuit to the wells from rising.

As mentioned above, even in the circuitry shown in FIG. 7, control is given in order to nearly nullify the offset voltage occurring in the sense amplifier. It will not take place unlike the circuitry of the related art shown in FIG. 2 that the potential at the output node SQ is driven low during the second cycle. A malfunction will therefore not occur. Consequently, the timing of activating the sense amplifier can be advanced. Eventually, the reading action of the sense amplifier is speeded up.

Moreover, similarly to the first embodiment, the sense amplifier may be formed on an SOI wafer. In this case, the capacitance of capacitors parasitic to the wells of the MOS transistors can be minimized. Eventually, the reading action of the sense amplifier is further speeded up.

Moreover, when the sense amplifier is activated, at least one of the output lines WLL and WLR (well nodes) extending from the second control circuit to the wells of the MOS transistors M10, M11, M14, and M15 may be nearly floated. In this case, the parasitic capacitors formed between the wells of paired transistors and the substrate are connected to each other. The capacitance of the parasitic capacitors is equivalently minimized. Eventually, the reading action of the sense amplifier is further speeded up.

As indicated with dashed lines in FIG. 7, capacitors CWLL and CWLR may be inserted in the well nodes or output lines. In this case, the phase of a feedback signal can be optimized. Eventually, the reading action of the sense amplifier is further speeded up.

THIRD EXAMPLE

Figure 8:
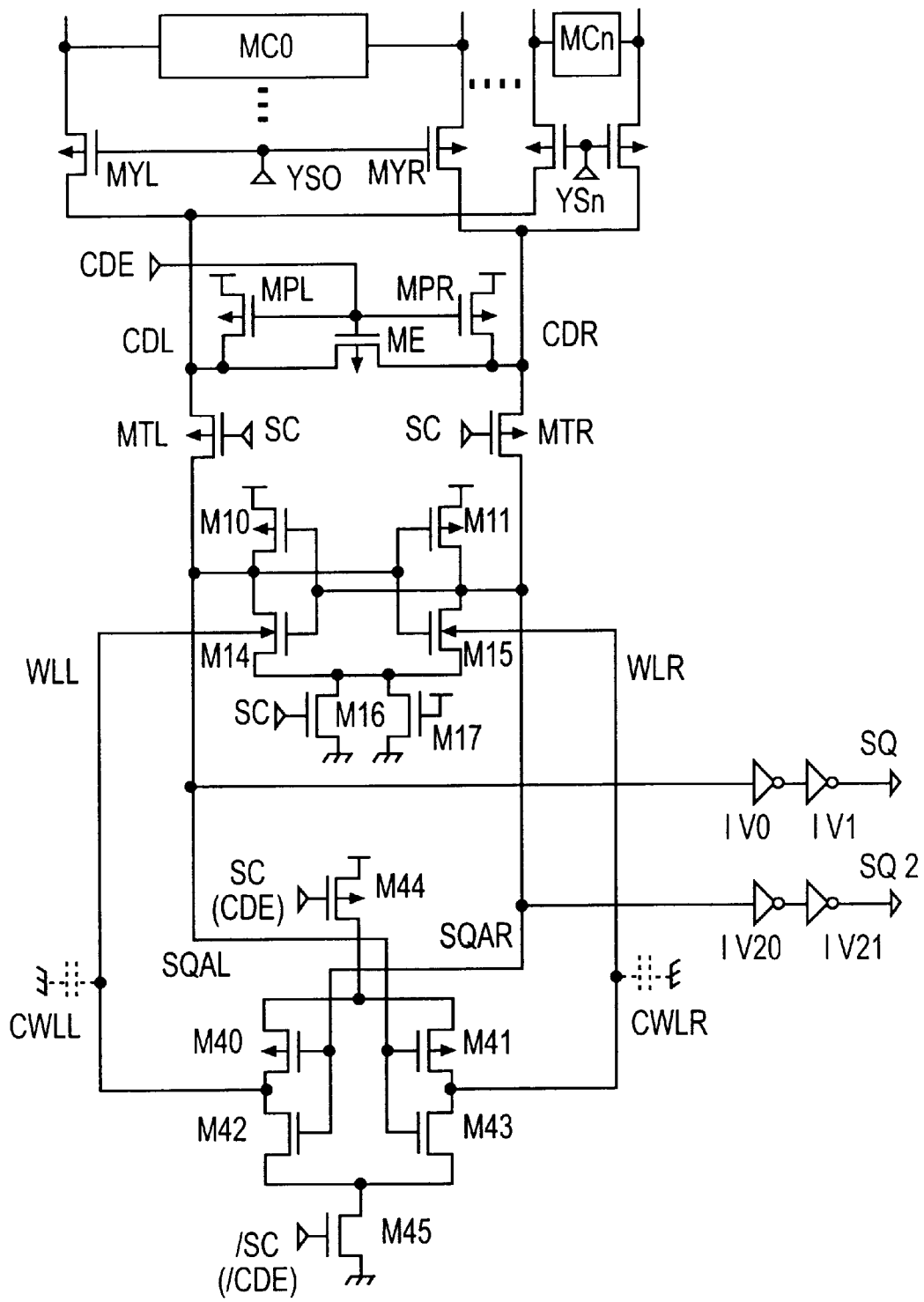
FIG. 8 is a circuit diagram showing the third example of the present invention.

FIG. 8 is a circuit diagram showing a major portion of a semiconductor memory in accordance with the third example of the present invention. The circuitry shown in FIG. 8 is a more practical form of the circuitry shown in FIG. 3. The circuits shown in FIG. 3 are realized with CMOS transistors.

A sense amplifier employed in this example includes a latching sub-sense amplifier composed of MOS transistors M10, M11, M14, M15, and M16. The wells of paired MOS transistors M14 and M15 included in the latching sub-sense amplifier are electrically isolated from the wells of the other MOS transistors. Moreover, the sense amplifier of this example is designed to supply a voltage developed at the inverting output node /SQ. Inverters IV20 and IV21 are therefore added in order to match the timing of supplying the voltage developed at the inverting output node /SQ with the timing of supplying a voltage developed at the output node SQ.

When the sense amplifier is on standby, the first control circuit composed of the MOS transistors MPL, MPR, and ME brings an input signal of the sense amplifier to zero. At this time, the second control circuit composed of the MOS transistors M40 and M45 uses voltages to feed back the potentials in the wells of the paired MOS transistors M14 and M15. The voltages used are those developed on the output signal lines SQAL and SQAR linking the sub-sense amplifiers because of an offset voltage occurring in the sense amplifier. Thus, control is given in order to nearly nullify the offset voltage occurring in the sense amplifier. In other words, the potentials on the output lines WLR and WLL extending from the second control circuit that inputs the potentials on the output signal lines SQAL and SQAR are applied to the wells of the MOS transistors M15 and M14.

Even when the MOS transistors constituting the sense amplifier mutually differ in terms of property, since the offset voltage occurring in the sense amplifier is nearly nullified, the timing of activating the sense amplifier can be advanced. Eventually, the reading action of the sense amplifier is speeded up.

A further description will be made below. In the circuitry of the third example shown in FIG. 8, a MOS transistor M17 is added to the ordinary latching sub-sense amplifier. Owing to the MOS transistor M17, even when the activating signal SC is low and the sense amplifier is on standby, voltages are developed on the output signal lines SQAL and SQAR respectively because of an offset voltage occurring in the latching sub-sense amplifier.

For example, when the threshold voltage of the MOS transistor M15 is higher than that of the MOS transistor M14, the potential on the output signal line SQAL is lowered. When the activating signal SC (or a precharge control signal CDE used to precharge common data lines) is low, the MOS transistors M44 and M45 constituting the second control circuit are turned on. The differential amplifier composed of the MOS transistors M40 to M43 is activated. Consequently, a potential difference between the output signal lines SQAL and SQAR is amplified. The potentials on the output signal lines WLL and WLR extending from the second control circuit are applied to the wells of the paired MOS transistors M14 and M15, so that the offset voltage occurring in the sense amplifier will be nearly nullified.

For example, when the potential on the output signal line SQAL is lower, the potential on the output line WLR extending from the second control circuit which is applied to the well of the MOS transistor M15 is higher. Consequently, the threshold voltage of the MOS transistor M15 decreases. In other words, the MOS transistors act so as to reduce the offset voltage occurring in the sense amplifier. Finally, the offset voltage occurring in the sense amplifier is nearly nullified. Consequently, the timing of activating the sense amplifier can be advanced. Eventually, the reading action of the sense amplifier is speeded up.

In this example, the sense amplifier may be formed on an SOI wafer. In this case, the capacitance of capacitors parasitic to the wells of the MOS transistors can be minimized. Eventually, the reading action of the sense amplifier is further speeded up.

Moreover, when the sense amplifier is activated, at least one of the output lines (well nodes) WLL and WLR extending from the second control circuit to the wells of the MOS transistors M14 and M15 may be nearly floated. In this case, the parasitic capacitors formed between the wells thereof and the substrate are connected in series each other. The capacitance of the parasitic capacitors can therefore be minimized equivalently. Eventually, the reading action of the sense amplifier is further speeded up.

Moreover, capacitors CWLL and CWLR may be inserted in the output lines (well nodes) as indicated with dashed lines in FIG. 8. In this case, the phase of a feedback signal can be optimized. Eventually, the reading action of the sense amplifier is further speeded up.

FOURTH EXAMPLE

Figure 9:
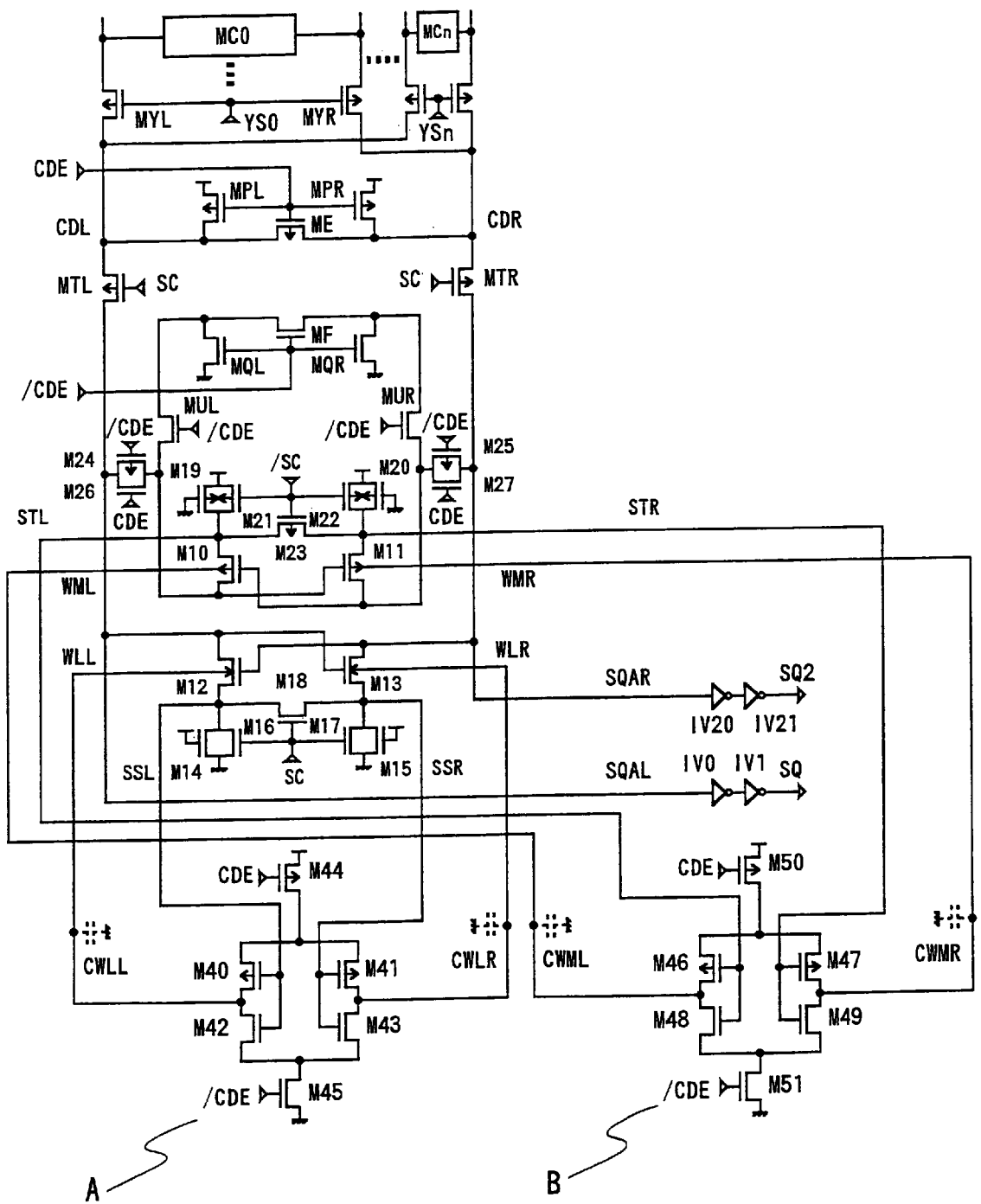
FIG. 9 is a circuit diagram showing the fourth example of the present invention.

FIG. 9 is a circuit diagram showing a major portion of a semiconductor memory in accordance with the fourth example of the present invention. The circuitry shown in FIG. 9 is a more practical form of the circuitry shown in FIG. 3. The circuits shown in FIG. 3 are formed with CMOS transistors.

A sense amplifier employed in the fourth example includes, as shown in FIG. 9, a latching sub-sense amplifier composed of MOS transistors M10, M11, M12, M13, M16, M17, M18, M21, M22, and M23. The wells of the pairs of MOS transistors M10, M11, M12, and M13 included in the latching sub-sense amplifier are electrically isolated from the wells of the other MOS transistors.

When the sense amplifier is on standby, a first control circuit composed of the MOS transistors MPL, MPR, ME, MQL, MQR, and MF brings an input signal of he sense amplifier to nearly zero. At this time, voltages are developed on signal lines SSL, SSR, STL, and STR respectively because of an offset voltage occurring in the sense amplifier. A second control circuit composed of MOS transistors M40 to M45 and M46 to M51 uses the voltages on the signal lines to feed back the potentials in the wells of the pairs of MOS transistors M12, M13, M10, and M11. Thus, control is given in order to nearly nullify the offset voltage occurring in the sense amplifier.

Specifically, the potentials on the output lines WLL and WLR extending from a differential amplifier A are applied to the wells of the paired MOS transistors M12 and M13. The differential amplifier A is composed of the MOS transistors M40 to M45 and inputs the potentials on the signal lines SSL and SSR. Moreover, the potentials on the output lines WML and WMR extending from a differential amplifier B are applied to the wells of the paired MOS transistors M10 and M11. The differential amplifier B is composed of MOS transistors M46 to M51 and inputs the potentials on output lines WML and WMR.

Thus, even when the MOS transistors constituting the sense amplifier mutually differ in terms of property, the offset voltage occurring in the sense amplifier is nearly nullified. Consequently, the timing of activating the sense amplifier can be advanced. Eventually, the reading action of the sense amplifier is speeded up.

A further description will be made below. In the circuitry of the fourth example shown in FIG. 9, MOS transistors M14, M15, M19, and M20 are added to the latching sub-sense amplifier. Owing to the MOS transistors M14, M15, M19, and M20, even when the activating signal SC is low and the sense amplifier is on standby, voltages are developed on the signal lines SSL, SSR, STL, and STR respectively because of the offset voltage occurring in the latching sub-sense amplifier.

For example, assume that the threshold voltage of the MOS transistor M12 is higher than that of the MOS transistor M13 and that the threshold voltage of the MOS transistor M10 is lower than that of the MOS transistor M11 (absolute value is larger). In this case, the potential on the signal line SSL drops. Since the MOS transistor M10 is a PMOS transistor, the potential on the signal line STL rises.

When the precharge control signal CDE used to precharge the common data lines is low, the MOS transistors M44, M45, M50, and M51 are turned on. The differential amplifiers A and B composed of the MOS transistors M40 to M43 and the MOS transistors M46 to M49 respectively are activated. The differential amplifiers A and B amplify a potential difference between the signal lines SSL and SSR and a potential difference between the signal lines STL and STR. The potentials in the wells of the pairs of MOS transistors M12, M13, M10, and M11 are controlled so that the offset voltage occurring in the sense amplifier will be nearly nullified.

For example, when the potential on the signal line SSL is lower, the potential on the output line WLL extending from the differential amplifier A is applied. Consequently, the potential in the well of the MOS transistor M12 is raised, and the threshold voltage of the MOS transistor M12 decreases. Moreover, when the potential on the signal line STL is higher, the potential on the output line WML extending from the differential amplifier B is applied. Consequently, the potential in the well of the MOS transistor M10 is lowered, and the threshold voltage of the PMOS transistor M10 increases (absolute value decreases). In other words, the MOS transistors act so as to reduce the offset voltage occurring in the sense amplifier. Finally, the offset voltage occurring in the sense amplifier is nearly nullified. The timing of activating the sense amplifier can therefore be advanced. Eventually, the reading action of the sense amplifier is speeded up.

Even in the fourth example, the sense amplifier may be formed on an SOI wafer. In this case, the capacitance of capacitors parasitic to the wells of the MOS transistors can be minimized. Eventually, the reading action of the sense amplifier is speeded up.

Moreover, when the sense amplifier is activated, at least one of the output lines (well nodes) WLL, WLR, WML, and WMR extending from the second control circuit to the wells of the MOS transistors M10, M11, M12, and M13 may be nearly floated. In this case, the parasitic capacitors formed between the wells of paired MOS transistors and the substrate are connected in series with each other. Eventually, the reading action of the sense amplifier is further speeded up.

Capacitors CWLL, CWLR, CWML, and CWMR may be added to the output lines (well nodes) as indicated with dashed lines in FIG. 9. In this case, the phase of a feedback signal can be optimized. Eventually, the reading action of the sense amplifier is further speeded up.

FIFTH EXAMPLE

Figure 10:
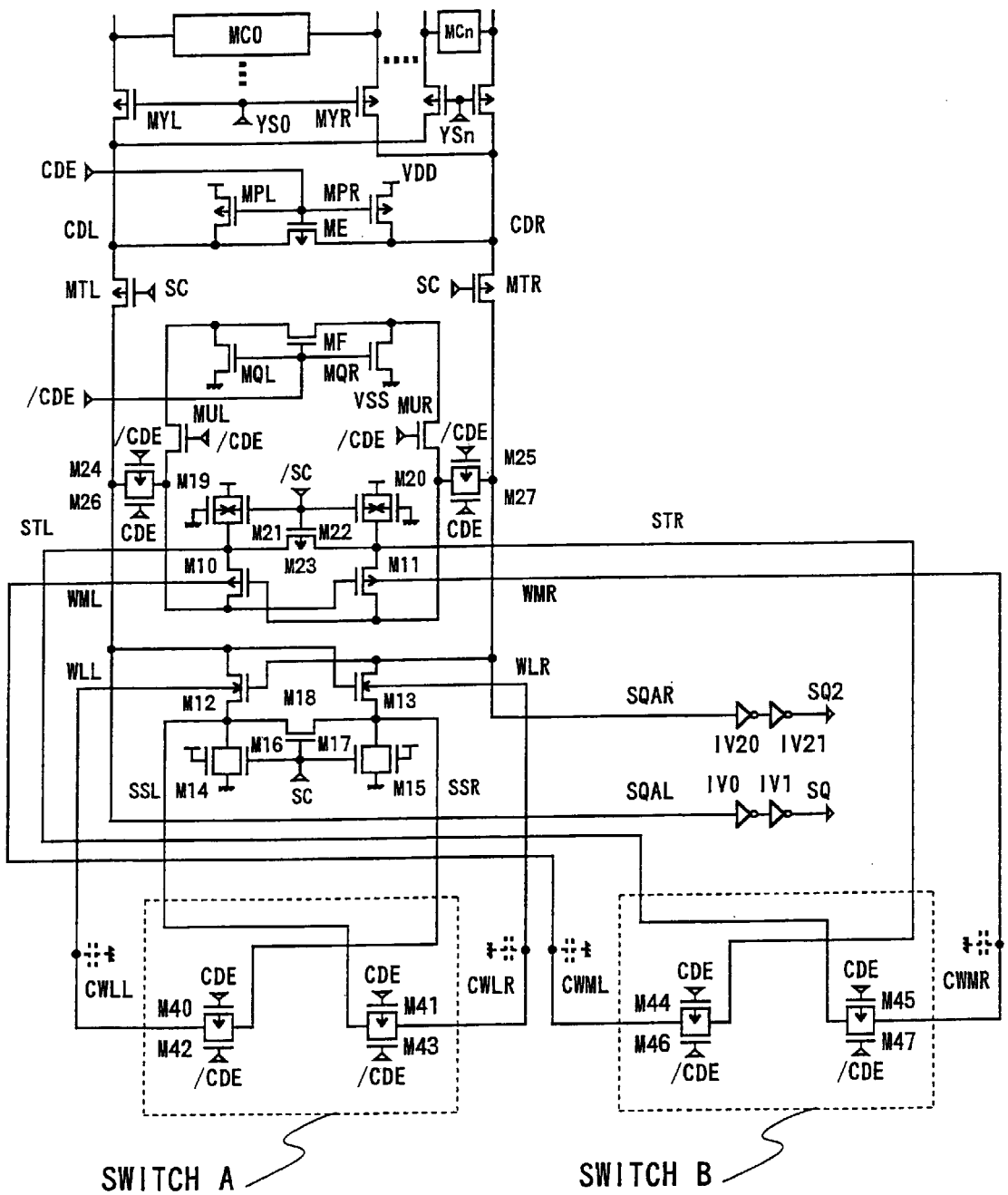
FIG. 10 is a circuit diagram showing the fifth example of the present invention.

FIG. 10 is a circuit diagram showing a major portion of a semiconductor memory in accordance with the fifth example of the present invention. The circuitry of the fifth example is different from the circuitry of the fourth example shown in FIG. 9 in a point described below. That is to say, referring to FIG. 9, the second control circuit consists of the differential amplifiers A and B composed of the MOS transistors M40 to M45 and the MOS transistors M46 to M51 respectively. In contrast, in the circuitry of the fifth example shown in FIG. 10, a second control circuit consists of switches A and B composed of MOS transistors M40 to M43 and MOS transistors M44 to M47 respectively.

Even the fifth example provides the same advantage as the fourth example. Namely, since the offset voltage occurring in the sense amplifier can be minimized, the timing of activating the sense amplifier can be advanced. Eventually, the reading action of the sense amplifier is speeded up.

Even in the fifth example, the sense amplifier may be formed on an SOI wafer. In this case, the capacitance of capacitors parasitic to the wells of the MOS transistors can be minimized. Eventually, the reading action of the sense amplifier is speeded up.

Moreover, when the sense amplifier is activated, at least one of the output lines (well nodes) WLL, WLR, WML, and WMR extending from the second control circuit to the wells of the MOS transistors M10 to M13 may be nearly floated. In this case, the parasitic capacitors of paired MOS transistors formed between the wells thereof and the substrate are connected in series with each other. The capacitance of the parasitic capacitors can be minimized equivalently. Eventually, the reading action of the sense amplifier is further speeded up.

Moreover, capacitors CWLL, CWLR, CWML, and CWMR may be added to the output lines or well nodes as indicated with dashed lines in FIG. 10. In this case, the phase of a feedback signal can be optimized. Eventually, the reading action of the sense amplifier is further speeded up.

SIXTH EXAMPLE

Figure 11:
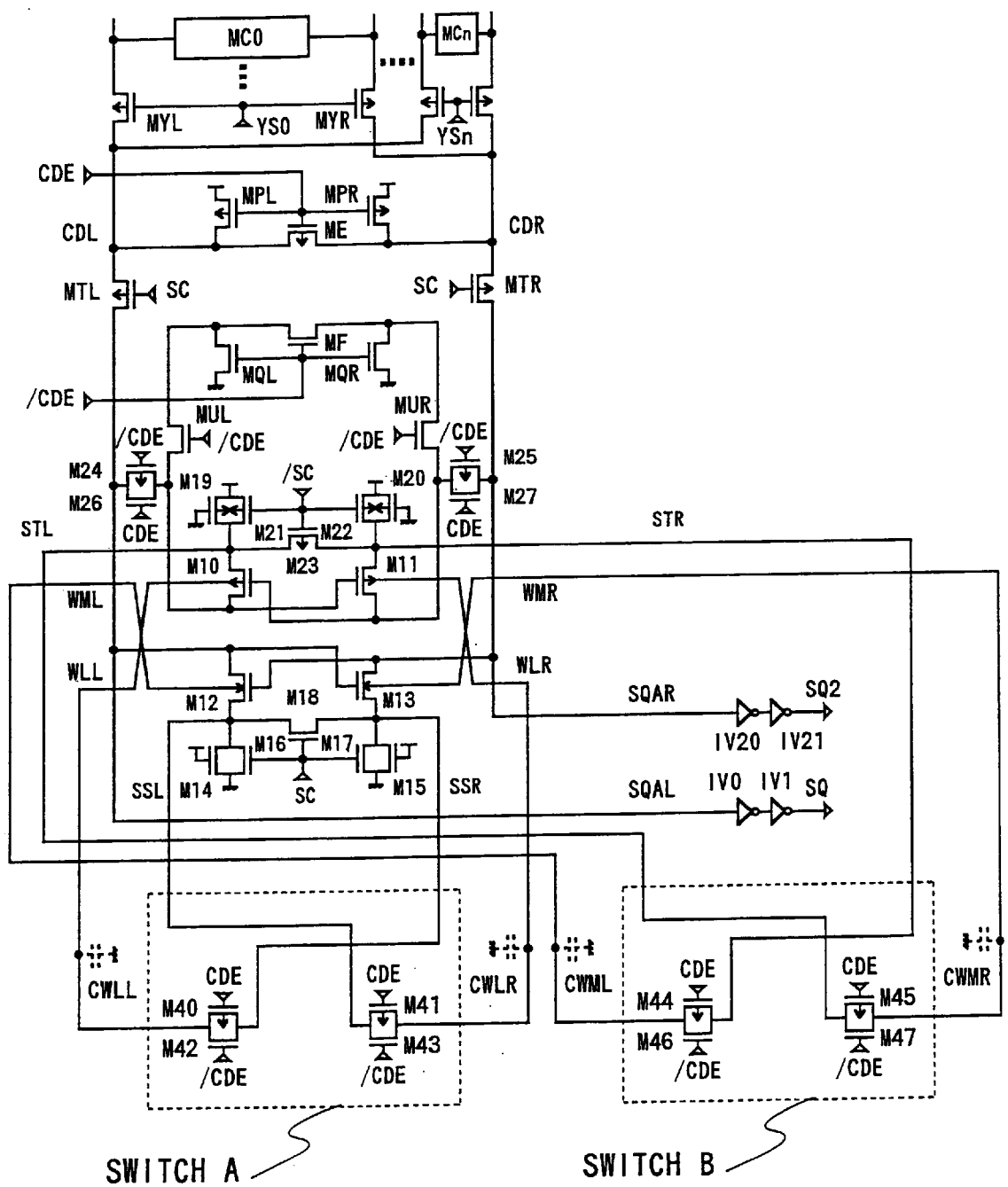
FIG. 11 is a circuit diagram showing the sixth example of the present invention.

FIG. 11 is a circuit diagram showing a major portion of a semiconductor memory in accordance with the sixth example of the present invention. The circuitry of the sixth example is different from the circuitry of the fifth example shown in FIG. 10 in a point described below. That is to say, referring to FIG. 10, the output lines WLL, WLR, WML, and WMR are extended from the second control circuit to the wells of the pairs of MOS transistors M12, M13, M10, and M11.

In contrast, in the sixth example shown in FIG. 11, the output lines WLL, WLR, WML, and WMR are extended from the second control circuit to the wells of the pairs of MOS transistors M10, M11, M12, and M13.

Even the sixth example provides the same advantage as the fifth example. Namely, since the offset voltage occurring in the sense amplifier can be minimized, the timing of activating the sense amplifier can be advanced. Eventually, the reading action of the sense amplifier is speeded up.

Even in the sixth example, the sense amplifier may be formed on an SOI wafer. In this case, the capacitance of capacitors parasitic to the wells of the MOS transistors can be minimized. Eventually, the reading action of the sense amplifier is further speeded up.

Moreover, when the sense amplifier is activated, at least one of the output lines (well nodes) WLL, WLR, WML, and WMR extending from the second control circuit to the wells of the MOS transistors M10 to M13 may be nearly floated. In this case, the parasitic capacitors of the paired MOS transistors formed between the wells thereof and substrate are connected in series with each other. Consequently, the capacitance of the parasitic capacitors can be minimized equivalently. Eventually, the reading action of the sense amplifier is further speeded up.

Moreover, capacitors CWLL, CWLR, CWML, and CWMR may be inserted in the output lines or well nodes as indicated with dashed lines in FIG. 11. In this case, the phase of a feedback signal can be optimized. Eventually, the reading action of the sense amplifier is further speeded up.

SEVENTH EXAMPLE

Figure 12:
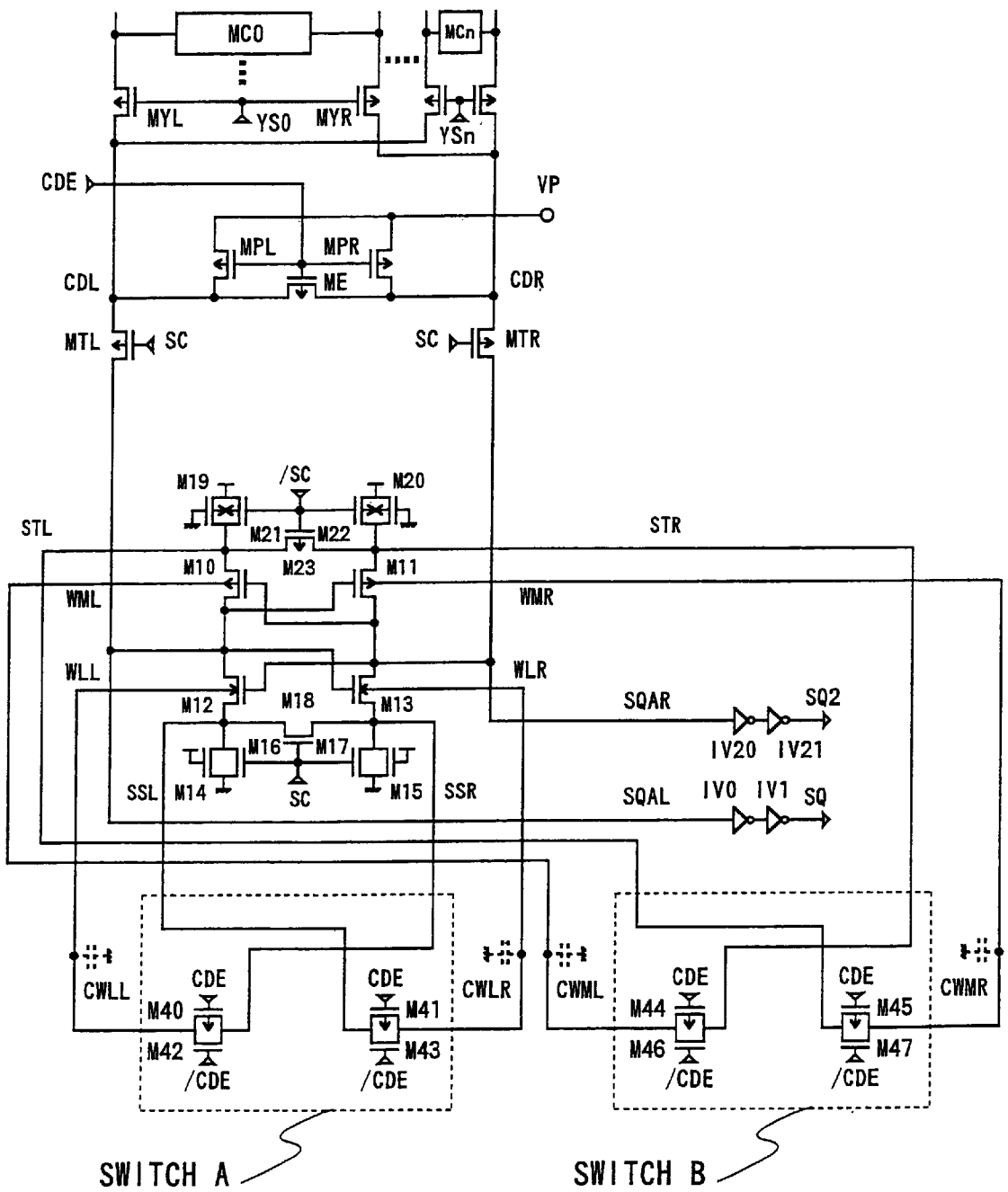
FIG. 12 is a circuit diagram showing the seventh example of the present invention.

FIG. 12 is a circuit diagram showing a major portion of a semiconductor memory in accordance with the seventh example of the present invention. The circuitry of this example is different from the one of the fifth example shown in FIG. 10 in a point described below. That is to say, referring to FIG. 10, when the sense amplifier is on standby, the first control circuit (that is, a precharge circuit) composed of MOS transistors MPL, MPR, and ME precharges the drains and gates of the paired MOS transistors M12 and M13 to the same level as the supply voltage VDD. The first control circuit thus brings an input signal of the sense amplifier to nearly zero. The precharge circuit composed of the MOS transistors MQL, MQR, and MF precharges the drains and gates of the paired MOS transistors M10 and M11 to the same level as the supply voltage VSS (ground voltage in the example shown in FIG. 10).

In contrast, in the circuitry of this example shown in FIG. 12, when the sense amplifier is on standby, a precharge circuit precharges the drains and gates of paired MOS transistors M12 and M13 and those of paired MOS transistors M10 and M11 to the same level as an intermediate voltage VP between the supply voltages VDD and VSS. The precharge circuit composed of MOS transistors MPL, MPR, and ME thus brings an input signal of the sense amplifier to nearly zero. This is an only difference.

Even the seventh example provides the same advantage as the fifth example. Namely, an offset voltage occurring in the sense amplifier can be minimized. Consequently, the timing of activating the sense amplifier can be advanced. Eventually, the reading action of the sense amplifier is speeded up.

Even in the seventh example, the sense amplifier may be formed on an SOI wafer. In this case, the capacitance of capacitors parasitic to the wells of the MOS transistors can be minimized. Eventually, the reading action of the sense amplifier is further speeded up.

Moreover, when the sense amplifier is activated, at least one of the output lines (well nodes) WLL, WLR, WML, and WMR extending from the second control circuit to the wells of the MOS transistors M10 to M13 may be floated. In this case, the parasitic capacitors of paired MOS transistors formed between the wells thereof and the substrate are connected in series with each other. Consequently, the capacitance of the parasitic capacitors can be minimized equivalently. Eventually, the reading action of the sense amplifier is further speeded up.

Furthermore, capacitors CWLL, CWLR, CWML, and CWMR may be inserted in the output lines or well nodes as indicated with dashed lines in FIG. 12. In this case, the phase of a feedback signal can be optimized. Eventually, the reading action of the sense amplifier is further speeded up.

EIGHTH EXAMPLE

Figure 13A:
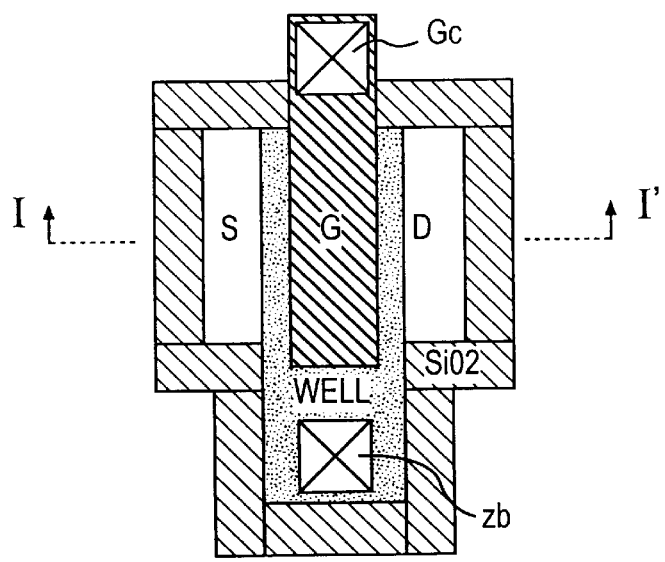
FIG. 13A is a schematic plan view of a MOS transistor employed in the eighth example of the present invention.
Figure 13B:
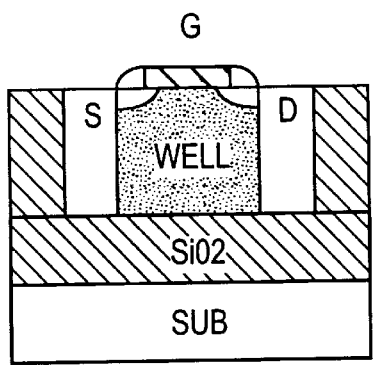
FIG. 13B is a schematic sectional view showing the MOS transistor shown in FIG. 13A along an I–I' cutting line.

FIG. 13A and FIG. 13B schematically show the basic structure of a MOS transistor formed on an SOI wafer employed in the first to seventh examples of a semiconductor memory in accordance with the present invention. FIG. 13A is a plan view showing the MOS transistor formed on the SOI wafer. FIG. 13B illustratively shows the sectional structure of the MOS transistor along an I–I' cutting line in the plan view. In FIG. 13A and FIG. 13B, there are shown a gate G, a source S, a drain D, a well WELL, a dielectric $SiO_2$, a substrate SUB, a contact hole zb for a well terminal, a contact hole Gc for a gate electrode.

Figure 14:
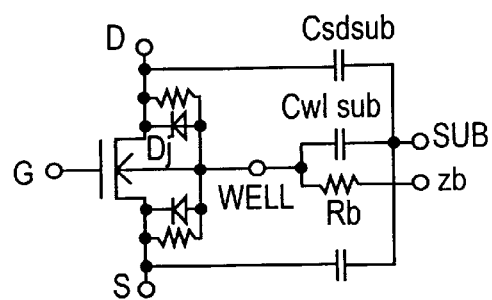
FIG. 14 is an equivalent circuit diagram of a MOS transistor having the structure shown in FIG. 13A and FIG. 13B.

FIG. 14 shows an equivalent circuit of the MOS transistor formed on the SOI wafer. In FIG. 14, there are shown a parasitic junction diode Dj formed between the diffused layer including the source and drawn and the well, a parasitic capacitor Csdsub formed between the diffused layer including the source and drain and the substrate, and a parasitic capacitor Cwlsub formed between the well and substrate.

When a MOS transistor is formed on an SOI wafer, a capacitor parasitic to the well node WELL of the MOS transistor, that is, the parasitic capacitor Cwlsub shown in FIG. 14 can be minimized. The potential in the well can be controlled quickly. Eventually, the reading action of a sense amplifier employed in any of the aforesaid examples is speeded up.

As apparent from the aforesaid example, according to the present invention, even when transistors constituting a sense amplifier included in a semiconductor memory mutually differ in terms of property, an offset voltage occurring in the sense amplifier can be reduced. Consequently, the timing of activating the sense amplifier can be advanced. Eventually, the reading action of the sense amplifier is speeded up. This results in the high-speed semiconductor memory.

Moreover, when the sense amplifier is formed on an SOI wafer, the capacitance of capacitors parasitic to the well nodes of MOS transistors can be minimized. Consequently, the potentials in the wells can be controlled quickly. Eventually, the reading action of the sense amplifier is speeded up.

Moreover, when the sense amplifier is activated, the wells of the MOS transistors maybe nearly floated. In this case, the capacitance of the parasitic capacitors can be minimized equivalently. Eventually, the reading action of the sense amplifier is speeded up.

Furthermore, when capacitors are inserted in the well nodes of the MOS transistors, the phase of a feedback signal can be optimized. Eventually, the reading action of the sense amplifier is further speeded up.

Figure 15:
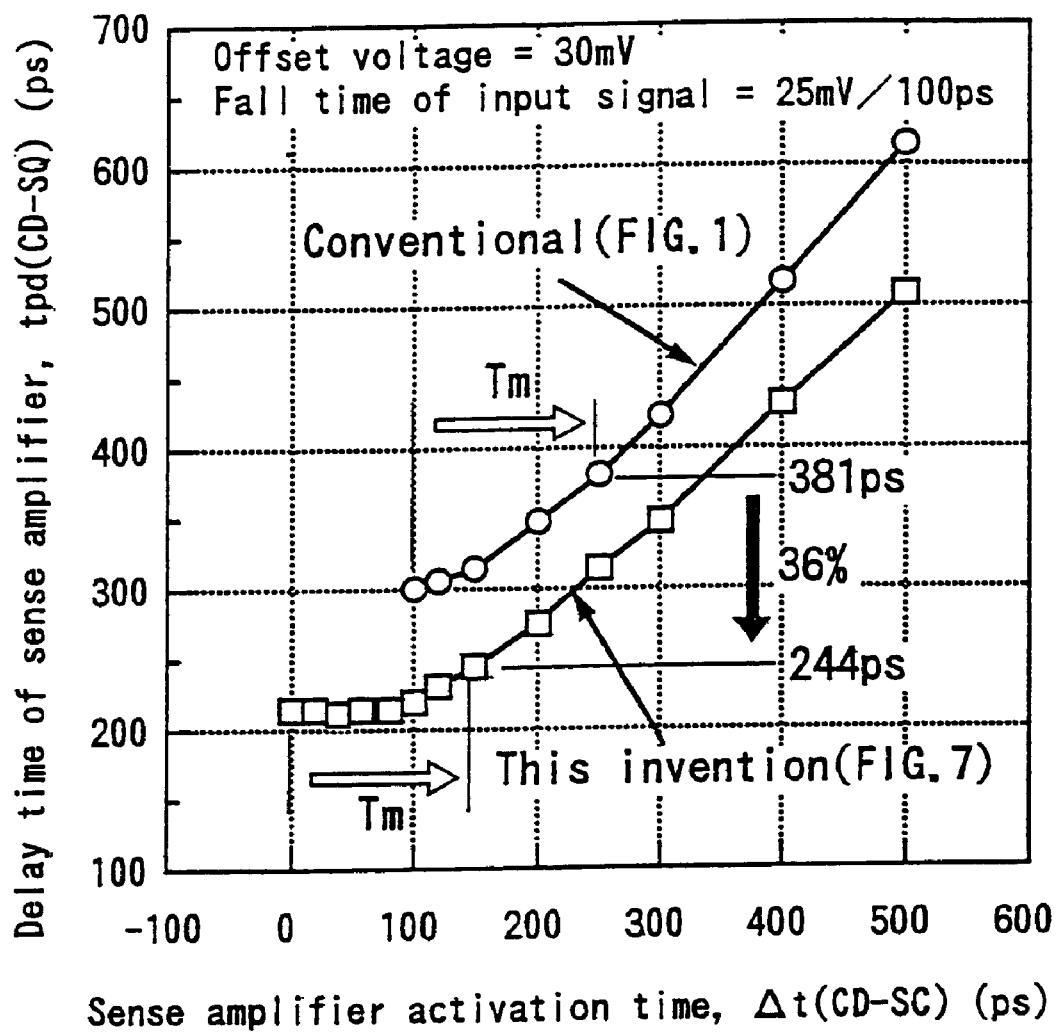
FIG. 15 indicates the advantage of the present invention.

FIG. 15 indicates an example of the advantage of the present invention. The circuitry of the related art shown in FIG. 1 and the circuitry of the second example shown in FIG. 7 are used to discuss the relationship between the timing of activating a sense amplifier, Δt(CD–SC), and a delay time of the sense amplifier, tpd, by performing simulation. Herein, Δt(CD–SC) expresses a time required after the precharge control signal CDE is driven high and the potential on one of the common data lines CDL and CDR starts dropping until the activating signal SC is driven high. tpd(CD . SQ) expresses a time required after the potential on one of the common data lines CDL and CDR starts dropping until the potential at the output node SQ is changed.

Moreover, simulation is carried out on the assumption that an offset voltage occurring in the sense amplifier is 30 mV, and the falling rate of an input signal is 25 mV/100 ps.

As shown in FIG. 15, as far as the circuitry of the related art shown in FIG. 1 is concerned, when the timing of activating the sense amplifier, Δt, becomes equal to or shorter than 100 ps, a malfunction takes place because of the offset voltage occurring in the sense amplifier. In the circuitry of a semiconductor memory in accordance with the present invention shown in FIG. 7, as long as the timing of activating the sense amplifier, Δt, falls below 0 ps, the semiconductor memory acts normally. Assuming that the margin for the timing of activating the sense amplifier relative to a malfunction is 150 ps, the delay time tpd required by the sense amplifier shown in FIG. 1 is 381 ps. The delay time tpd required by the sense amplifier shown in FIG. 7 is 244 ps. Thus, the reading action of the sense amplifier is speeded up by 36%.

The preferred embodiment and examples of the present invention have been described previously. The present invention will not be limited to the preferred embodiment and examples. Various modifications in design can be made within the spirit and scope of the present invention.

What is claimed is:

1. A semiconductor memory having memory cells arranged on a semiconductor wafer in the form of a lattice, and including a sense amplifier composed of a plurality of MOS transistors for reading information from the memory cells, wherein:

the well of one MOS transistor belonging to at least one pair of MOS transistors out of a plurality of pairs of MOS transistors, each pair of which has the same conductivity channel and is connected mutually symmetrically, included in said plurality of MOS transistors constituting said sense amplifier is electrically isolated from the wells of the other MOS transistors, said semiconductor memory further comprising:

a first control circuit for bringing an input signal of said sense amplifier to nearly zero; and a second control circuit for using voltages, which are developed because of an offset voltage occurring in said sense amplifier whose input signal is brought to nearly zero by said first control circuit when said sense amplifier is on standby, to control the potentials in the electrically-isolated well of at least one of paired MOS transistors so that the offset voltage occurring in said sense amplifier will be nearly nullified.

2. A semiconductor memory according to claim 1, wherein said semiconductor wafer is an SOI wafer.

3. A semiconductor memory according to claim 1 or 2, wherein when said sense amplifier is activated, said second control circuit floats at least one of the wells of paired MOS transistors.

4. A semiconductor memory according to claim 1, wherein capacitors are inserted in output lines extending from said second control circuit for controlling the potentials in the wells.

5. A semiconductor memory according to claim 1, wherein said first control circuit is a precharge circuit for precharging common data lines in response to a precharge control signal.

6. A semiconductor memory according to claim 1, wherein said second control circuit is realized with a differential amplifier or a switching circuit.

* * * * *